US008807068B2

(12) United States Patent
Miyahara et al.

(10) Patent No.: US 8,807,068 B2
(45) Date of Patent: Aug. 19, 2014

(54) EQUIPMENT AND METHOD FOR MANUFACTURING SEMICONDUCTOR DEVICE

(75) Inventors: Tsutomu Miyahara, Tokyo (JP); Masahiro Ogushi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 13/358,854

(22) Filed: Jan. 26, 2012

(65) Prior Publication Data

US 2012/0276663 A1 Nov. 1, 2012

(30) Foreign Application Priority Data

Apr. 28, 2011 (JP) .................................. 2011-101474

(51) Int. Cl.
*B05C 1/00* (2006.01)
*H01L 23/00* (2006.01)

(52) U.S. Cl.
CPC .............. *H01L 24/743* (2013.01); *H01L 24/27* (2013.01); *H01L 2924/01006* (2013.01); *H01L 24/83* (2013.01); *H01L 24/97* (2013.01); *H01L 2224/83192* (2013.01); *H01L 2224/743* (2013.01); *H01L 2224/32245* (2013.01); *H01L 2924/01005* (2013.01); *H01L 2924/01074* (2013.01)
USPC .......................................... 118/255; 438/108

(58) Field of Classification Search
CPC ................ H01L 2224/743; H01L 2924/01084
USPC ..................... 118/255, 713; 438/119; 361/735
See application file for complete search history.

(56) References Cited

U.S. PATENT DOCUMENTS

| 5,316,397 A * | 5/1994 | Robertson et al. ........ 400/124.04 |
| 7,357,013 B2 * | 4/2008 | Frohlich .......................... 72/430 |
| 2002/0109217 A1 * | 8/2002 | Nam et al. ..................... 257/686 |
| 2004/0212083 A1 * | 10/2004 | Yang ............................. 257/723 |
| 2006/0144331 A1 * | 7/2006 | Hanafusa et al. ............. 118/712 |

FOREIGN PATENT DOCUMENTS

| JP | 08-266980 | * 10/1996 | ............... B05C 9/00 |
| JP | 10-32216 A | 2/1998 | |
| JP | 11-67796 | 3/1999 | |
| JP | 2001-284374 A | 10/2001 | |
| JP | 2010-118468 A | 5/2010 | |

OTHER PUBLICATIONS

Translation of Kobayashi et al (JP08-266980) (Oct. 15, 1996) 3 pages.*
Office Action issued Feb. 19, 2014, in Japanese Patent Application No. 2011-101474 with English translation.

* cited by examiner

Primary Examiner — Caridad Everhart
(74) *Attorney, Agent, or Firm* — Oblon, Spivak, McClelland, Maier & Neustadt, L.L.P.

(57) ABSTRACT

According to an embodiment, equipment for manufacturing a semiconductor device includes a first block, a plurality of stamp pins, a second block and a plurality of springs. The first block includes a plurality of first through-holes penetrating from a first major surface to a second major surface. The stamp pins are inserted into each of the first through-holes from the first major surface, each of the stamp pins having an end projected from the second major surface and being capable of moving forward and backward in the insertion direction. The second block has a plurality of second through-holes with an inner diameter larger than an inner diameter of the first through-holes, the second through-holes being disposed so as to overlap with the first through-holes; and the springs are disposed in each of the second through-holes, for biasing the stamp pins in the insertion direction.

13 Claims, 8 Drawing Sheets

EQUIPMENT AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2011-101474, filed on Apr. 28, 2011; the entire contents of which are incorporated herein by reference.

FIELD

Embodiments are related generally to equipment and a method for manufacturing a semiconductor device.

BACKGROUND

For mounting semiconductor chips incorporated in a semiconductor device package, paste-like adhesive members have been widely used. For example, when mounting the semiconductor chips to a lead frame, a fixed amount of silver paste or silicone paste is applied to a surface of the frame, and the semiconductor chips are mounted thereon. To improve productivity and quality of a semiconductor device, the amount of the adhesive member applied onto the frame is required to be uniform. A tact time for mounting the chips on the frame is also desired to be reduced.

For these purposes, a stamping method is used for applying the paste, for example. In the stamping method, paste is caused to adhere to a leading end of a needle, called a stamp pin, and the paste is transferred to a surface of the frame. This method is advantageous in that an amount of the paste can be controlled with ease, and the tact time is short.

However, when transferring paste having high viscosity by the stamping method, it is required for suppressing stringiness to reduce the transferring speed of the paste. Thus, a problem emerges in that a tact time becomes longer.

Therefore, manufacturing equipment that permits a member having a high viscosity to be applied uniformly in a short tact time and a method for manufacturing the semiconductor device are required.

BRIEF DESCRIPTION OF THE DRAWINGS

FIGS. 3A to 4B are schematic views illustrating a manufacturing process of the semiconductor device according to the first embodiment;

DETAILED DESCRIPTION

According to an embodiment, equipment for manufacturing a semiconductor device includes a first block, a plurality of stamp pins, a second block and a plurality of springs. The first block has a first major surface and a second major surface on a side opposite to the first major surface, and includes a plurality of first through-holes penetrating from the first major surface to the second major surface. The stamp pins are inserted into each of the first through-holes from a side of the first major surface, each of the stamp pins having an end projected from the second major surface and being capable of moving forward and backward in the insertion direction. The second block attached to the first major surface to be placed on the first block, has a plurality of second through-holes with an inner diameter larger than an inner diameter of the first through-holes, the second through-holes being disposed so as to overlap with the first through-holes; and the springs are disposed in each of the second through-holes, for biasing the stamp pins in the insertion direction.

Embodiments of the invention will now be described with reference to the drawings. In the following explanations, same components are marked with like reference numerals, a detailed description thereof is omitted as appropriate, and a description is given on different parts.

First Embodiment

Figure 1A:
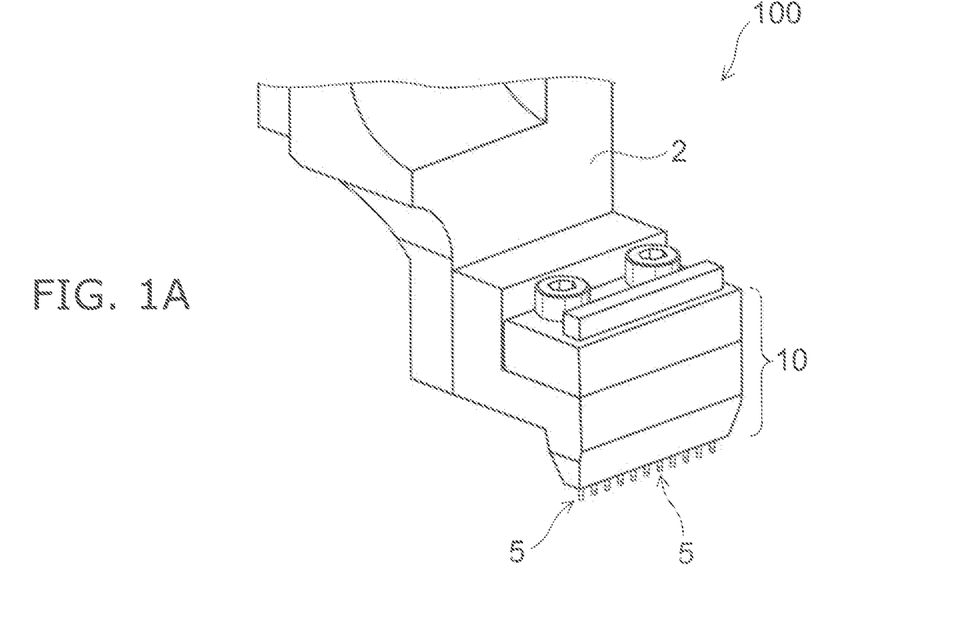
FIGS. 1A and 1B are partial perspective views illustrating manufacturing equipment for the semiconductor device according to a first embodiment.
Figure 1B:
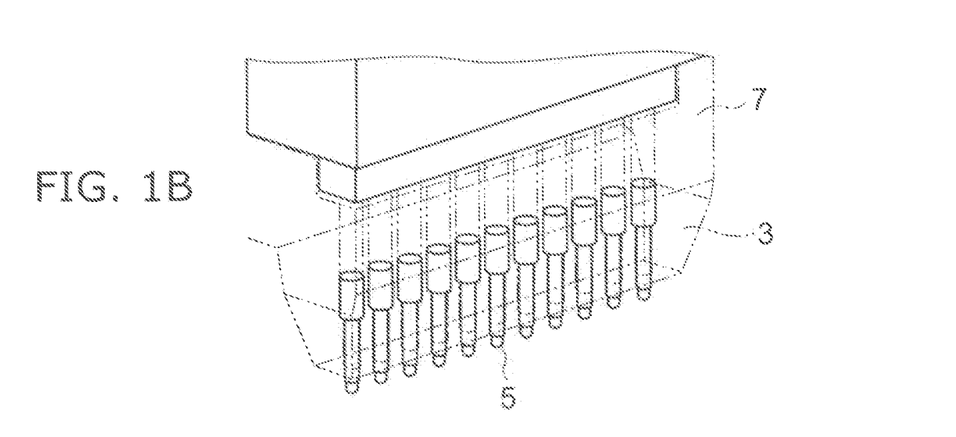

FIGS. 1A and 1B are perspective views showing a part of equipment 100 for manufacturing a semiconductor device according to a first embodiment. For example, the manufacturing equipment 100 is a stamping paste applicator. FIG. 1A is a perspective view schematically showing a nozzle part of the manufacturing equipment 100. FIG. 1B is a perspective view schematically showing the structure of a nozzle 10 included in the manufacturing equipment 100.

The nozzle 10 is mounted on a holder 2 which is supported by a cabinet (not shown) and moves in a vertical direction and a horizontal direction. As shown in FIG. 1A, leading ends of stamp pins 5 are projected from a lower face of the nozzle 10, and, for example, an adhesive member such as silver paste, silicone paste or the like is caused to adhere thereto and transferred to a plate-like work piece, while the holder 2 moves with the nozzle 10.

As shown in FIG. 1B, the nozzle 10 includes a first block 3 and a second block 7, and stamp pins 5 are disposed inside the through-holes provided in each of the first block 3 and the second block 7. In the embodiment shown in FIG. 1B, the 10 stamp pins 5 are arranged in a straight line. However, it is not limited to this, and a given number of the stamp pins 5 may be provided.

Figure 2:
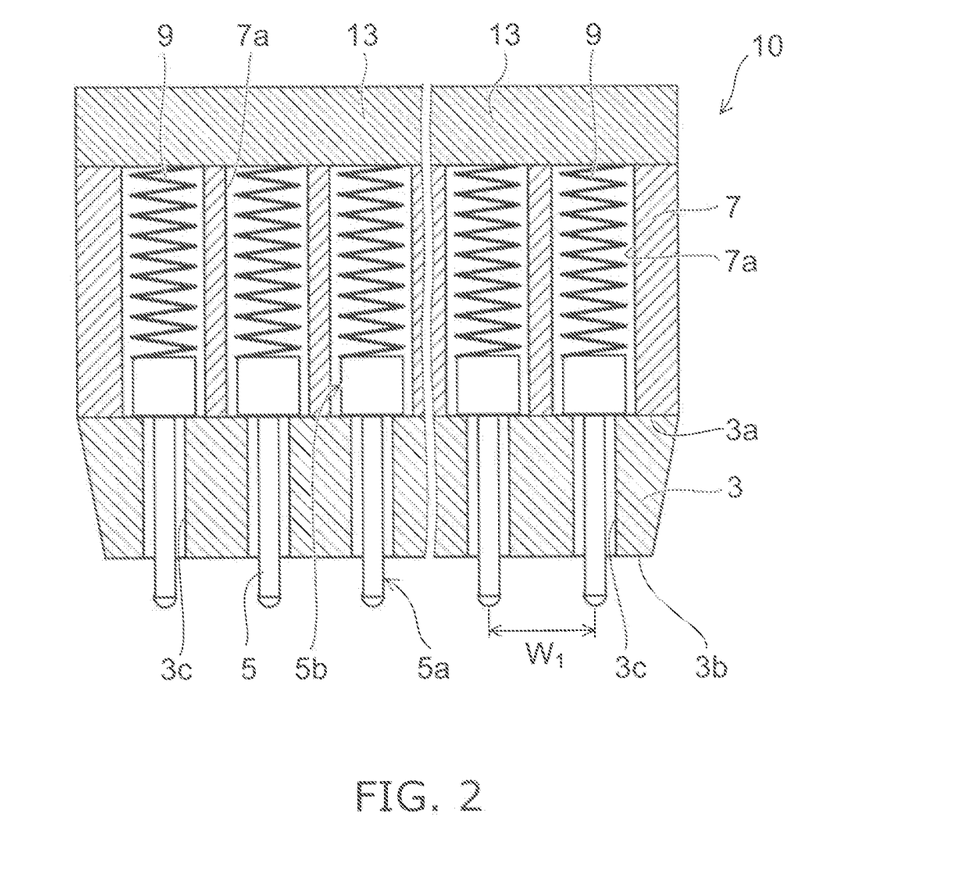
FIG. 2 is a partial sectional view schematically illustrating manufacturing equipment for the semiconductor device according to the first embodiment.

Next, details of the nozzle 10 will be described referring to FIG. 2. FIG. 2 is a partial sectional view schematically showing a cross section of the nozzle 10. As shown in FIG. 2, the nozzle 10 has such a configuration that the first block 3 and the second block 7 are stacked, in which the stamp pins 5 are provided.

The first block 3 has a first major surface 3a and a second major surface 3b on the side opposite to the first major surface 3a. The first block 3 has a plurality of first through-holes 3c which penetrate from the first major surface 3a to the second major surface 3b. The stamp pins 5 are inserted from the side of the first major surface 3a in the first through-holes 3c respectively.

In the embodiment, for example, the ten first through-holes 3c are arranged in the straight line in the plane of the first major surface 3a. However, it is not limited to this, and a given number of the first through-holes 3c are provided depending on the number of the stamp pins 5. Moreover, the arrangement is not necessarily in the straight line either, and may be arranged in a matrix form or in a staggered form. A spacing $W_1$ between the adjoining stamp pins 5 is set, for example, to be the same with an arrangement interval of the semiconductor chips to be mounted on the plate.

Each stamp pin 5 has a major shaft 5a to be inserted in the first through-hole 3c and a shaft stopper 5b which has a shaft diameter larger than a diameter of the major shaft 5a. As shown in FIG. 2, while the shaft stoppers 5b are in contact with the first major surface 3a, the leading ends of the major shafts 5a are projected from the second major surface 3b.

The second block 7 has a plurality of second through-holes 7a, each having an inner diameter larger than an inner diameter of the first through-hole 3c, and is attached to the first major surface 3a of the first block 3 to be placed thereon. Furthermore, the first through-holes 3c and the second through-holes 7a are disposed so as to overlap in the plan view with respect to the first major surface 3a.

The shaft diameter of the shaft stoppers 5b of the stamp pins 5 is provided so as to be smaller than the inner diameter of the second through-hole 7a. As a result, the stamp pins 5 become able to freely move forward and backward in the insertion direction from the side of the first major surface 3a to the side of the second major surface 3b of the first block 3.

Further, springs 9 are disposed in each of the second through-holes 7a of the second block 7. The springs 9 are in contact with the lower face of the third block 13 attached to the second block 7 to be placed thereon, and with the upper faces of the shaft stoppers 5b of the stamp pins 5, and the springs 9 bias the stamp pins 5 to the insertion direction by using the lower face of the third block 13 as a fulcrum.

The first block 3 and the second block 7, and the second block 7 and the third block 13 are mutually fixed with screws (not shown). As a result, the respective blocks are assembled so as to be decomposable. Hence, the less number of the stamp pins 5 may be inserted into the first through-holes 3c depending on the work piece.

Next, a manufacturing process of the semiconductor device according to the first embodiment will be described referring to FIGS. 3A to 4B. FIGS. 3A to 4B are schematic views showing the process of mounting semiconductor chips 31 on a plate 21.

Figure 3A:
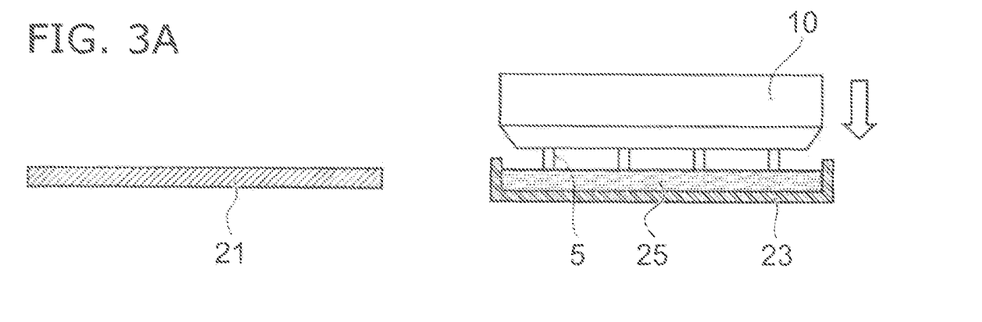

First, as shown in the FIG. 3A, the nozzle 10 is moved onto a paste plate 23 filled with an adhesive member 25 to cause the leading ends of the stamp pins 5 to contact the adhesive member 25. The adhesive member 25 is, for example, a silicone paste.

Figure 3B:
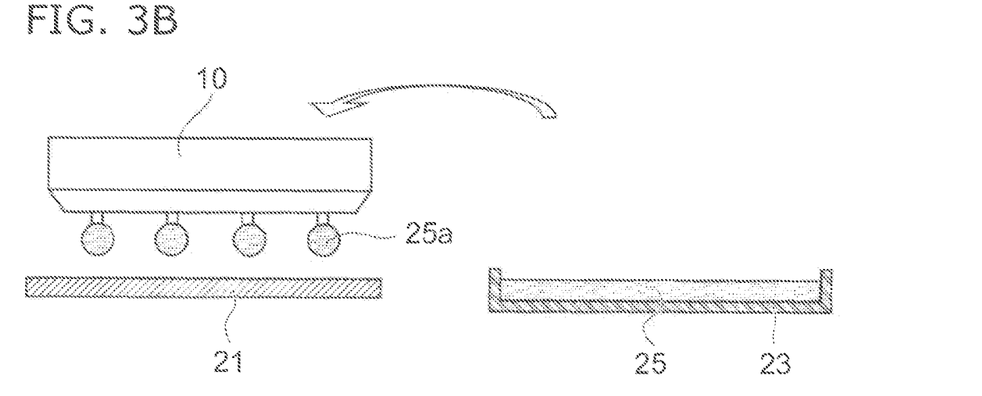

Subsequently, as shown in FIG. 3B, with an adhesive member 25a adhering to the leading ends of the stamp pins 5, the nozzle 10 is moved onto the plate 21. An amount of the adhesive member 25a adhering to the leading ends of the stamp pin 5 can be controlled by the thickness of the adhesive member 25 filled in the paste plate 23. The plate 21 is, for example, a metal plate provided with a plurality of lead frames.

Figure 3C:
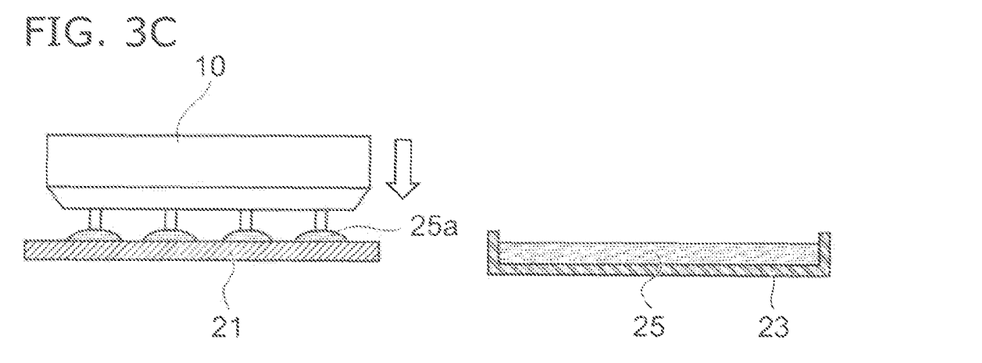

Next, as shown in the FIG. 3C, the nozzle 10 is lowered, and the adhesive members 25a adhering to the respective leading ends of the plurality of stamp pins 5 are transferred onto the plate 21 at one time. For example, by adjusting an interval $W_1$ of the stamp pins 5 to an array pitch of the lead frames, the adhesive members 25a can be transferred onto the mounting positions of the semiconductor chips on the frame.

Figure 4A:
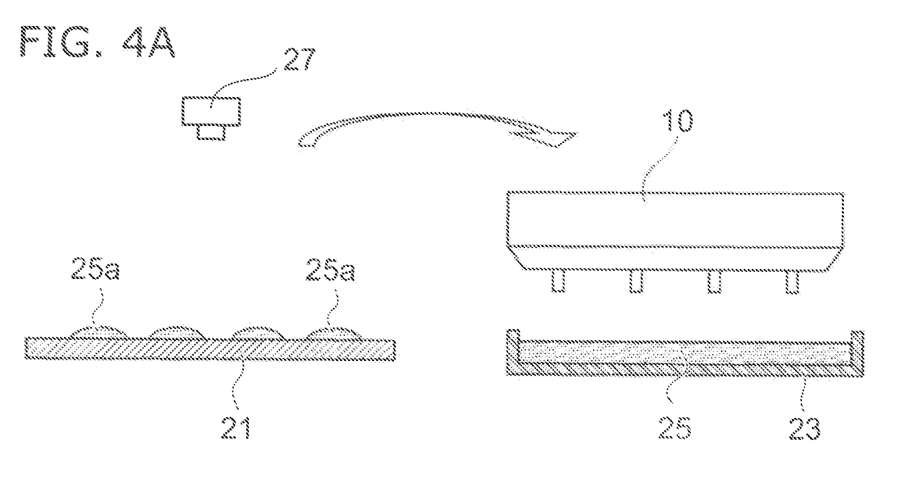

Subsequently, as shown in FIG. 4A, the nozzle 10 is moved above the paste plate 23 in order to cause the next adhesive members to adhere to the leading ends of the stamp pins. At the same time, the shape of the adhesive members 25a transferred is recorded, for example, through the use of an image pickup device 27.

Figure 5:
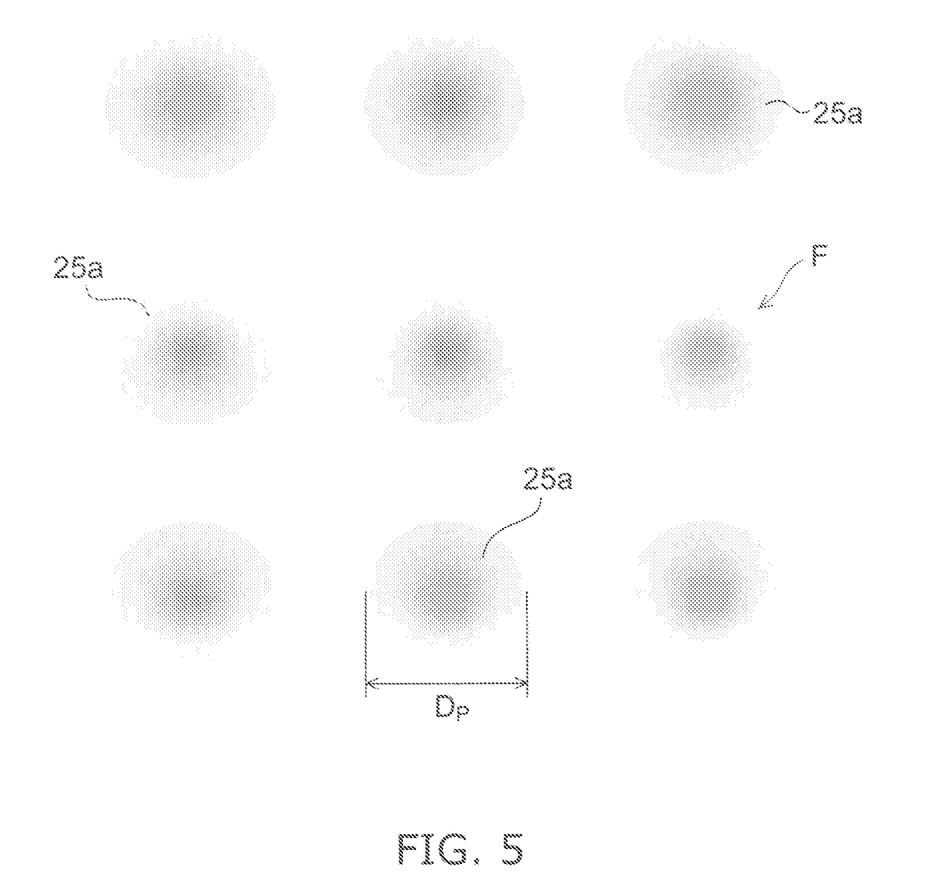
FIG. 5 is a plan view schematically illustrating adhesive members after transferring.

FIG. 5 is a plan view schematically illustrating the adhesive members 25a after being transferred. As shown in FIG. 5, the adhesive members 25a adhering to the leading ends of the stamp pins 5 may be transferred in a complete round shape by the surface tension. Therefore, it is possible to determine an amount of the adhesive member 25a by controlling the diameter $D_P$ of the adhesive member 25a transferred on the plate 21.

For example, like in the case of the adhesive member indicated by "F" in FIG. 5, the plate having a small diameter $D_P$ is determined to be defective because the amount of the adhesive member is less than a predetermined amount. That is, an image obtained by an image analysis system including the image pickup device 27 may be analyzed, and for example, based on the range of $D_P$ in which an amount of the adhesive member 25a is appropriate, the plate having a diameter outside the range is determined to be defective because the amount of the adhesive member is insufficient or excessive.

Figure 4B:
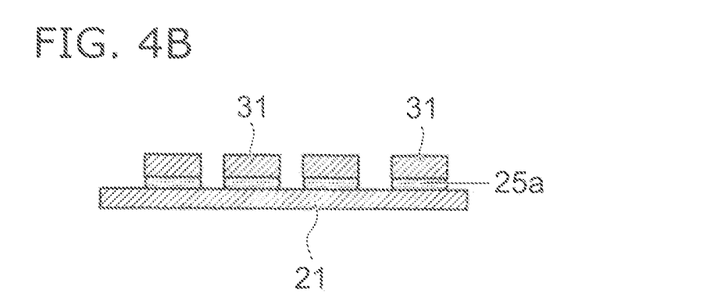

Next, when the transfer of the adhesive member 25a has been completed, as shown in FIG. 4B, the semiconductor chips 31 are mounted on the plate 21. For example, the position of the adhesive member 25a as determined to be defective is recorded in a memory device included in the image analysis system, and the semiconductor chips 31 are mounted on adhesive members determined be non-defective among the plurality of adhesive members 25a.

As a result, it is possible to reduce a percent defective of the semiconductor chips 31 caused by, for example, insufficient bonding strength, and to improve a yield of a manufacturing process. Moreover, it is possible to suppress the abrasion of the semiconductor chips 31 and reduce the manufacturing costs.

As described above, in the manufacturing equipment 100 according to the embodiment, by using the nozzle 10 provided with the plurality of stamp pins 5, a plurality of the adhesive members 25a are transferred at the same time to the mounting positions of the semiconductor chips. As a result, it is possible to reduce a tack time, while maintaining the transfer time of the adhesive members 25a to be longer enough to suppress the stringiness. That is, it becomes possible to transfer a highly viscous adhesive member under stable conditions, thereby improving the manufacturing yield of the semiconductor device.

Figure 8:
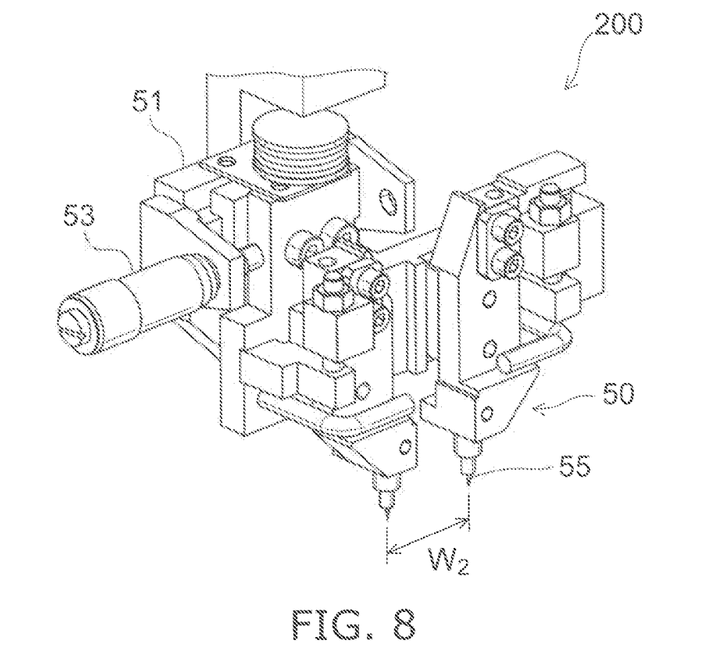
FIG. 8 is a perspective view schematically illustrating a part of manufacturing equipment for the semiconductor device according to a comparative example.

For example, FIG. 8 is a perspective view schematically showing a nozzle portion of manufacturing equipment 200 for the semiconductor device according to a comparative example. The manufacturing equipment 200 is provided with two nozzles 50, each being provided with a stamp pin 55.

The nozzle 50 is mounted on a holder 51 which is supported by a casing (not shown) and moves in a vertical direction and a horizontal direction. For example, an interval $W_2$ between the respective stamp pins 55 provided at the leading ends of the two nozzles 50 can be adjusted, for example, by a micrometer 53, and it is therefore possible to transfer the adhesive members to the chip mounting positions at different intervals.

In the manufacturing equipment 200, the adhesive member 25a can be transferred to the two mounting positions at one time by using the two nozzles 50. For example, when transferring the adhesive members to the plate having 100 different mounting positions, the holder 51 makes fifty round trips between the paste plate 23 and the plate 21. For example, if the complete time required for transferring the all adhesive members to one plate is controlled to be 25 seconds in the manufacturing line, the time required for the holder 51 making one round trip between the paste plate 23 and the plate 21 is 0.5 seconds, and a tact time for transferring one adhesive member 25a is 0.25 seconds each in the manufacturing equipment 200.

In contrast, in the manufacturing equipment 100 according to the embodiment, the nozzle 10 is provided with the ten stamp pins 5, and thus the number of the round trips between the paste plate 23 and the plate 21, which the holder 2 makes, is ten, and the round trip time is increased to 2.5 seconds each. A tact time for transferring one adhesive member 25a is 0.25 seconds each, which is the same as a tact time of the manufacturing equipment 200.

When transferring the adhesive member having a high viscosity at which stringiness is generated in the round trip time of 0.5 seconds, it is necessary for suppressing the stringiness to make the round trip time longer than 0.5 seconds in the manufacturing equipment 200. Therefore, the tact time becomes longer than 0.25 seconds each. In contrast to this, in the manufacturing equipment 100, since the round trip time is long enough, i.e. 2.5 seconds, it is possible to deal with the adhesive member having the viscosity at which stringiness is generated in the round trip time of 0.5 seconds, maintaining the tact time of 0.25 seconds. That is, the manufacturing equipment 100 transfers an adhesive member having a higher viscosity than the manufacturing equipment 200. Furthermore, by increasing the number of the stamp pins 5, it is possible to deal with the adhesive member having a much higher viscosity. That is, in the manufacturing equipment for the semiconductor device according to the embodiment, it becomes possible to reduce a substantial tact time and stably transfer the adhesive member having a high viscosity.

Additionally, in the manufacturing equipment 100, each of the stamp pins 5 is biased in the direction of the plate 21 (the insertion direction into the block 3) by the springs 9. All the stamp pins 5 may have the same length, and the thickness of the first block 3 is uniform. Therefore, it is possible to make the length of portions of the stamp pins that project from the second major surface of the block 3 uniform. That is, each length of the portions of the stamp pins is the same with the length of the others. It is therefore possible to make an amount of the adhesive member 25 adhering to the leading ends of the stamp pins 5 uniform. Moreover, when transferring the adhesive member 25b to the plate 21, the springs 9 contract corresponding to a flatness of the plate 21, and the leading ends of the stamp pins 5 can be uniformly brought into contact with the surface of the plate 21. Therefore, an amount of the adhesive member 25a to be transferred to the surface of the plate 21 can be made uniform.

For example, integral formation of the plurality of the stamp pins in a comb shape can be considered to be used in a nozzle. However, it is difficult to align the leading ends of the integrally formed stamp pins. Thus, the amount of the adhesive member adhering to the leading ends varies to a large extent, and there is a case where the unevenness of the amount of the adhesive member to be transferred is caused. That is, the manufacturing equipment 100 according to the embodiment is advantageous in that an amount of the adhesive member to be transferred to the plate 21 is made uniform, and the manufacturing yield can be improved.

Furthermore, according to the manufacturing equipment 100, by adopting a configuration in which the nozzle 10 includes the first block 3 and the second block 7, it is advantageous in that the nozzle 10 can be made with ease, and the manufacturing costs of the nozzle 10 can be reduced.

Figure 9:
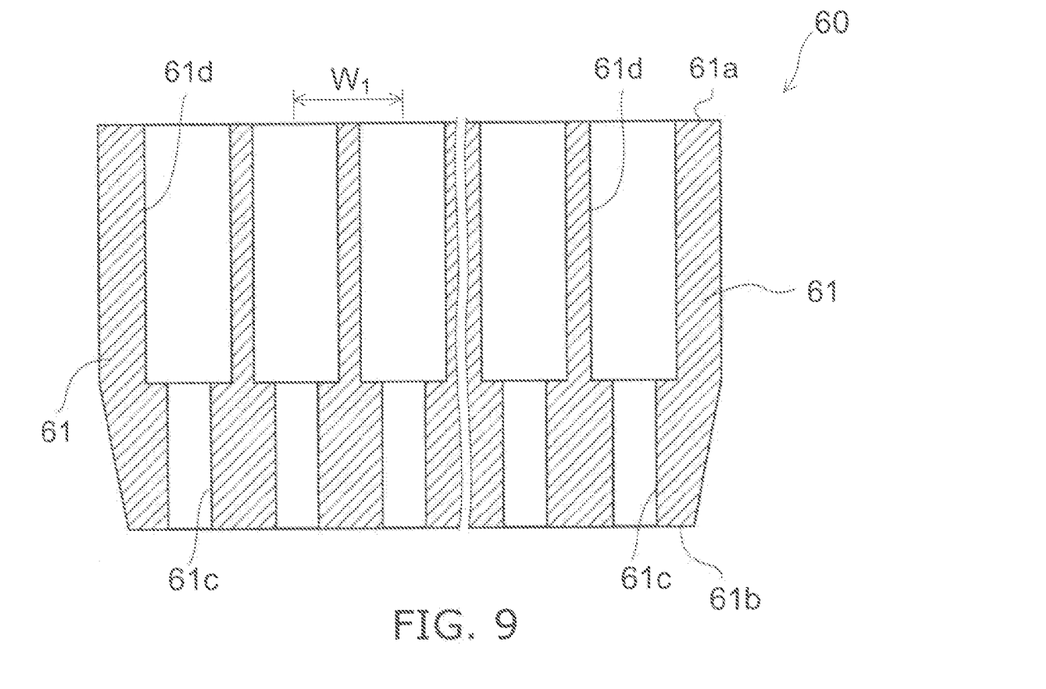
FIG. 9 is a partial cross-sectional view schematically illustrating a part of manufacturing equipment for the semiconductor device according to a comparative example.

For example, in a nozzle 60 according to a comparative example shown in FIG. 9, first through-holes 61c and second through-holes 61d are provided in one block 61. For example, in a manufacturing process of the nozzle 60, the second through-holes 61d are formed after forming the first through-holes 61c so as to penetrate from a first major surface 61a to a second major surface 61b of the block 61. An inner diameter of the second through-hole 61d is more extended than an inner diameter of the first through-hole 61c from the first major surface 61a to a central portion of the block 61.

In order to align the leading end positions of the stamp pins 5, the depth of the second through-holes 61d that extend from the first major surface 61a to the central portion of the block 61 is necessary to be controlled precisely. When the intervals of the through-holes become smaller, the inner diameter of each through-hole becomes smaller, and the processing of the second trough-holes 61d becomes more difficult. Furthermore, when a displacement in positions between the first through-holes 61c and the second through-holes 61d is taken into consideration, there may also arise a case where a minimum interval between the adjoining stamp pins has to be increased.

In contrast, according the nozzle 10 of the manufacturing equipment 100, the simple first through-holes 3c are formed in the first block 3 and the simple second through-holes 7a are merely formed in the second block 7. Therefore, processing is simple, and it is possible to improve processing accuracy, comparing with the manufacturing process of the nozzle 60. Moreover, the leading end positions of the stamp pins 5 are determined by the thickness of the first block 3 and the flatness of the first major surface. Therefore, it is easy to align the leading end positions of the semiconductor device, and it is possible to reduce a processing cost. Moreover, a processable minimum interval between the adjoining stamp pins 5 is determined by a pitch precision of the first through-holes 3c to be processed in the first block 3, and thus it is possible to make the nozzle 10 narrower than the nozzle 60 according to the comparative example.

Second Embodiment

Figure 6:
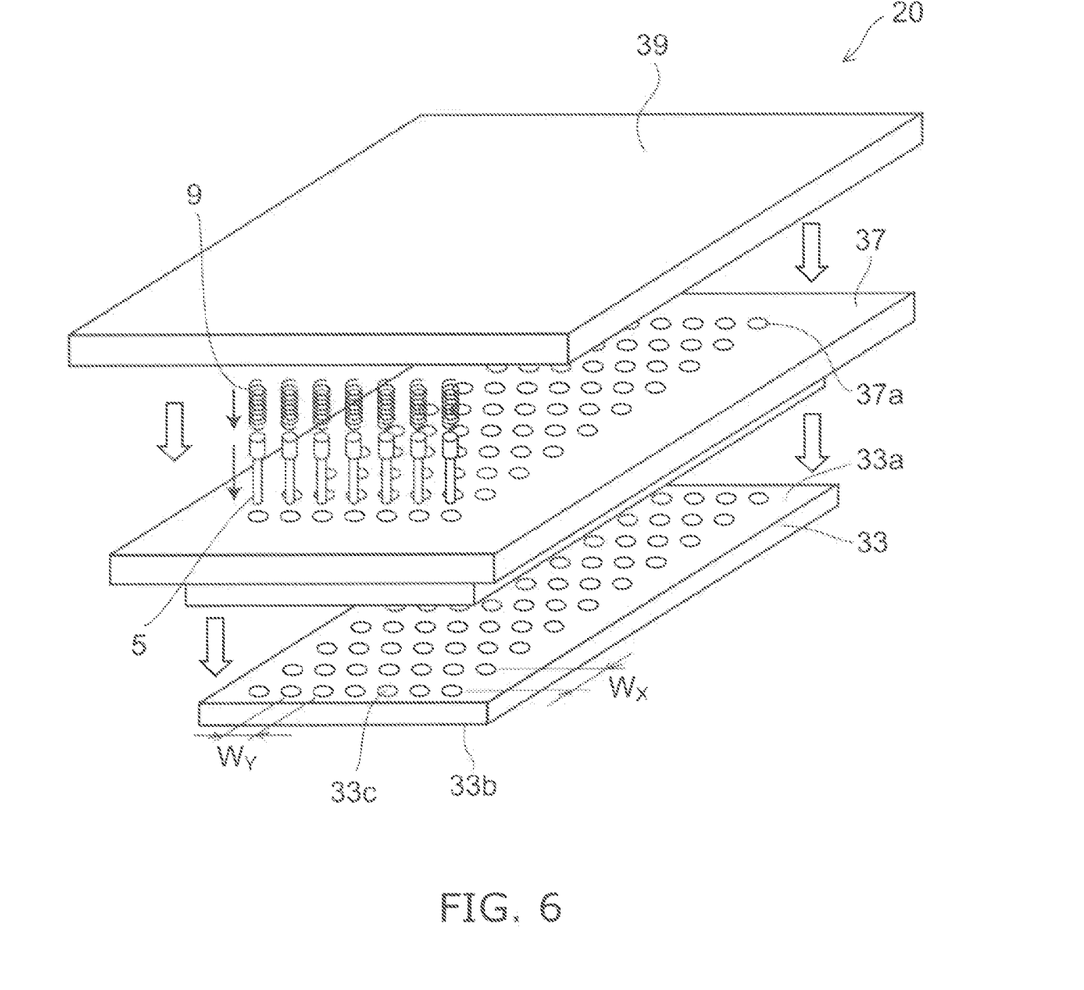
FIG. 6 is exploded perspective view schematically illustrating a part of manufacturing equipment for the semiconductor device according to a second embodiment.

FIG. 6 is exploded view schematically showing a nozzle 20 of manufacturing equipment for the semiconductor device according to a second embodiment. In the nozzle 20, a plurality of first through-holes 33c provided in a first block 33 are arranged in a matrix form in a plane of a first major surface 33a. Furthermore, a plurality of second through-holes 33c of a second block 37 are also provided in a matrix form and are arranged so as to overlap with the first through-holes 33c in a plan view parallel to the first major surface 33a.

As shown in FIG. 6, the second block 37 is attached to the first major surface 33a of the first block 33 to be placed thereon, and is fixed to the first block 33 with screws not shown, for example. Furthermore, the stamp pins 5 are inserted into the first through-holes 33c through the second through-holes 37a, and the springs 9 are inserted in the second through-holes 37a. Moreover, a third block 39 is stacked on the second block 37, and the stamp pins 5 inserted in the first block are biased in the direction from the first major surface 33a to the second major surface 33b by the elasticity of the springs 9.

Figures 7A, 7B, 7C:
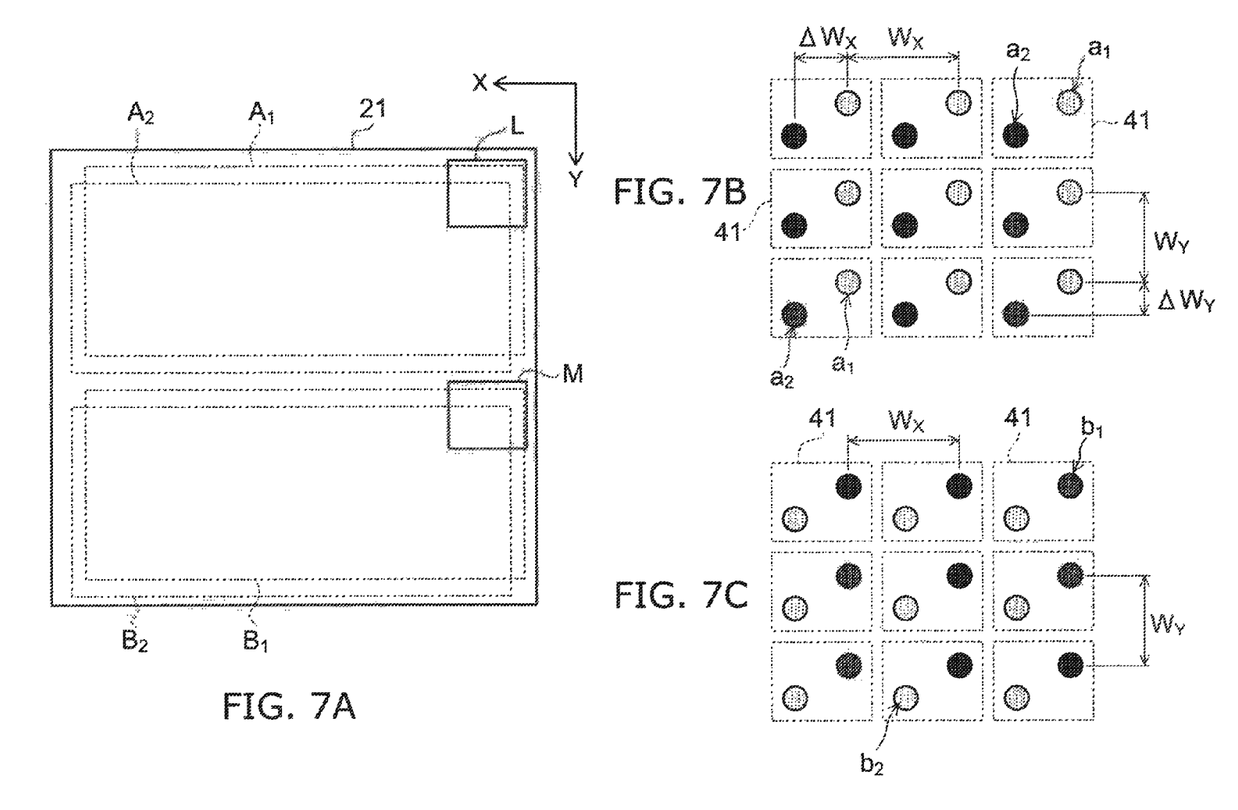
FIGS. 7A to 7C are plan views illustrating a method of transferring the adhesive member according to a second embodiment.

FIGS. 7A to 7C are plan views showing the method of transferring the adhesive member according to a second embodiment. FIG. 7A schematically shows transfer positions of the adhesive member on the surface of the plate 21. FIG. 7B shows positions to which the adhesive members are placed in an area L shown in FIG. 7A, and FIG. 7C shows positions to which the adhesive members are placed in an area M shown in FIG. 7A.

The dotted lines shown in the FIG. 7A indicate the transfer positions $A_1$, $A_2$, $B_1$ and $B_2$ of the adhesive member, and, for example, the nozzle 20 is pressed onto the surface of the plate 21 in order of $A_1$, $B_1$, $A_2$ and $B_2$.

FIG. 7B shows the arrangement of adhesive members $a_1$ and $a_2$. The adhesive members $a_1$ and $a_2$ are transferred from the nozzle 20 to the position $A_1$ that is the first transfer position and the position $A_2$ that is the second transfer position, respectively. For example, squares shown by the dotted lines in FIG. 7B indicate, for example, outer boundaries of the lead frames 41 provided on the plate 21. As shown in FIG. 7B, in an example shown in the embodiment, two adhesive members $a_1$ and $a_2$ are transferred onto one lead frame 41.

The pitches $W_X$ and $W_Y$ of the adhesive member $a_1$ shown in FIG. 7B are equal to the arrangement intervals of the lead frames 41 in the X-direction and the Y-direction, respectively. That is, the arrangement intervals $W_X$ and $W_Y$ of the first through-holes 33c (stamp pins 5) shown in FIG. 6 are arranged so as to be equal to the arrangement intervals of the lead frames 41.

The transfer position $A_2$ of the adhesive member $a_2$ is shifted only by $\Delta W_X$ in the X-direction and by $\Delta W_Y$ in the Y-direction from the transfer position $A_1$ of the adhesive member $a_1$. $\Delta W_X$ is smaller than a minimum interval in the X-direction between the adjoining stamp pins 5, and $\Delta W_Y$ is smaller than a minimum interval in the Y-direction between the adjoining stamp pins 5.

Moreover, also for the transfer positions $B_1$ and $B_2$ shown in FIG. 7C, the transfer position $B_2$ of the adhesive member $b_2$ is shifted only by $\Delta W_X$ in the X-direction and by $\Delta W_Y$ in the Y-direction from the transfer position $B_1$ of the adhesive member $b_1$. As a result, the two adhesive members $b_1$ and $b_2$ are transferred onto one lead frame 41.

Moreover, the foregoing embodiment shows that, even if the arrangement intervals $W_X$ and $W_Y$ of the stamp pins 5 are the minimum size being restricted by the processing precision of the first block 33 and the second block 37, it is possible to dispose the adhesive members at smaller pitches than $W_X$ and $W_Y$, that is, at smaller intervals than the stamp pins 5 by shifting the press positions of the nozzle 20 with the smaller intervals $\Delta W_X$ and $\Delta W_Y$.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. Equipment for manufacturing a semiconductor device, comprising:
   a first block having a first major surface and a second major surface on a side opposite to the first major surface, and including a plurality of first through-holes penetrating from the first major surface to the second major surface;
   a plurality of stamp pins inserted into each of the first through-holes from a side of the first major surface, each of the stamp pins having a shaft inserted into any one of the first through-holes and a stopper portion joined to the shaft, the shaft having an end projected from the second major surface and being capable of moving forward and backward in the insertion direction, and the stopper portion having a diameter larger than a diameter of the first through-holes;
   a second block attached to the first major surface to be placed on the first block, having a plurality of second through-holes with an inner diameter larger than an inner diameter of the first through-holes, the second through-holes being disposed so as to overlap with the first through-holes; and
   a plurality of springs disposed in each of the second through-holes, for biasing the stamp pins in the insertion direction,
   wherein each second through-hole includes the stopper portion of the stamp pins, and the stopper portion is in contact with the first major surface of the first block, when the end of the shaft is in a free position.

2. The equipment according to claim 1, wherein the first through-holes are arranged on a straight line in the first major surface.

3. The equipment according to claim 1, wherein the first through-holes are arranged in a matrix form in the first major surface.

4. The equipment according to claim 1, further comprising a third block placed on the second block,
   wherein the plurality of springs are provided between the third block and each stamp pin, and bias the stamp pins in the insertion direction by using a lower surface of the third block as a fulcrum.

5. The equipment according to claim 1, wherein the stamp pins have portions projected from the second major surface of the first block, each length of the portions being the same with the length of the others.

6. The equipment according to claim 1, wherein the first block and the second block are fixed to one another with a screw, and are decomposable.

7. The equipment according to claim 1,
   wherein the stamp pins include major shafts to be inserted into the first through-holes, and shaft stoppers having a shaft diameter larger than a diameter of the major shaft; and
   the shaft stoppers are smaller than an inner diameter of the second through-holes.

8. The equipment according to claim 7, wherein the stamp pins are biased so as to project the ends of the major shafts from the second major surface, while the shaft stoppers contact the first major surface of the first block.

9. The equipment according to claim 1, further comprising a holder moving in a vertical direction and a horizontal direction,
   wherein a nozzle including the first block, the plurality of stamp pins, the second block and the plurality of springs is mounted on the holder.

10. The equipment according to claim 9, wherein a paste-like adhesive member is caused to adhere to the ends of the stamp pins, and transferred to a surface of a plate-like work piece.

11. The equipment according to claim 10, wherein recessions and projections of the work piece are absorbed by contraction of the springs for biasing the stamp pins to cause the leading ends of the plurality of stamp pins to uniformly contact the work piece.

12. The equipment according to claim 10, further comprising an image analysis system taking an image of the transferred adhesive member.

13. The equipment according to claim 12, wherein the image analysis system analyses the image on the basis of the diameter of the transferred adhesive member.

\* \* \* \* \*